US007649969B2

(12) United States Patent
Parker

(10) Patent No.: US 7,649,969 B2
(45) Date of Patent: Jan. 19, 2010

(54) TIMING DEVICE WITH COARSE-DURATION AND FINE-PHASE MEASUREMENT

(75) Inventor: Larry Alan Parker, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 716 days.

(21) Appl. No.: 11/339,007

(22) Filed: Jan. 25, 2006

(65) Prior Publication Data

US 2007/0172009 A1 Jul. 26, 2007

(51) Int. Cl.
*H03D 3/24* (2006.01)

(52) U.S. Cl. ...................... 375/376; 375/373; 375/354; 375/327; 375/326

(58) Field of Classification Search ................ 375/376, 375/373, 354, 327, 326
See application file for complete search history.

(56) References Cited

U.S. PATENT DOCUMENTS 4,620,788 A * 11/1986 Giger ........................ 356/5.13
5,027,298 A * 6/1991 Khazam ..................... 702/176
5,793,709 A * 8/1998 Carley ........................ 368/113

* cited by examiner

*Primary Examiner*—Ted M Wang

(57) ABSTRACT

A high-precision measurement of a duration is calculated from a coarse duration measurement and at least one trigger-phase measurement.

18 Claims, 3 Drawing Sheets

TIMING DEVICE WITH COARSE-DURATION AND FINE-PHASE MEASUREMENT

TECHNICAL FIELD

The present invention relates to digital devices and methods and, more particularly, to digital timing devices and methods. Hereinunder, related art labeled "prior art" is admitted prior art; related art not labeled "prior art" is not admitted prior art.

DETAILED DESCRIPTION OF THE DRAWINGS

Figure 1:
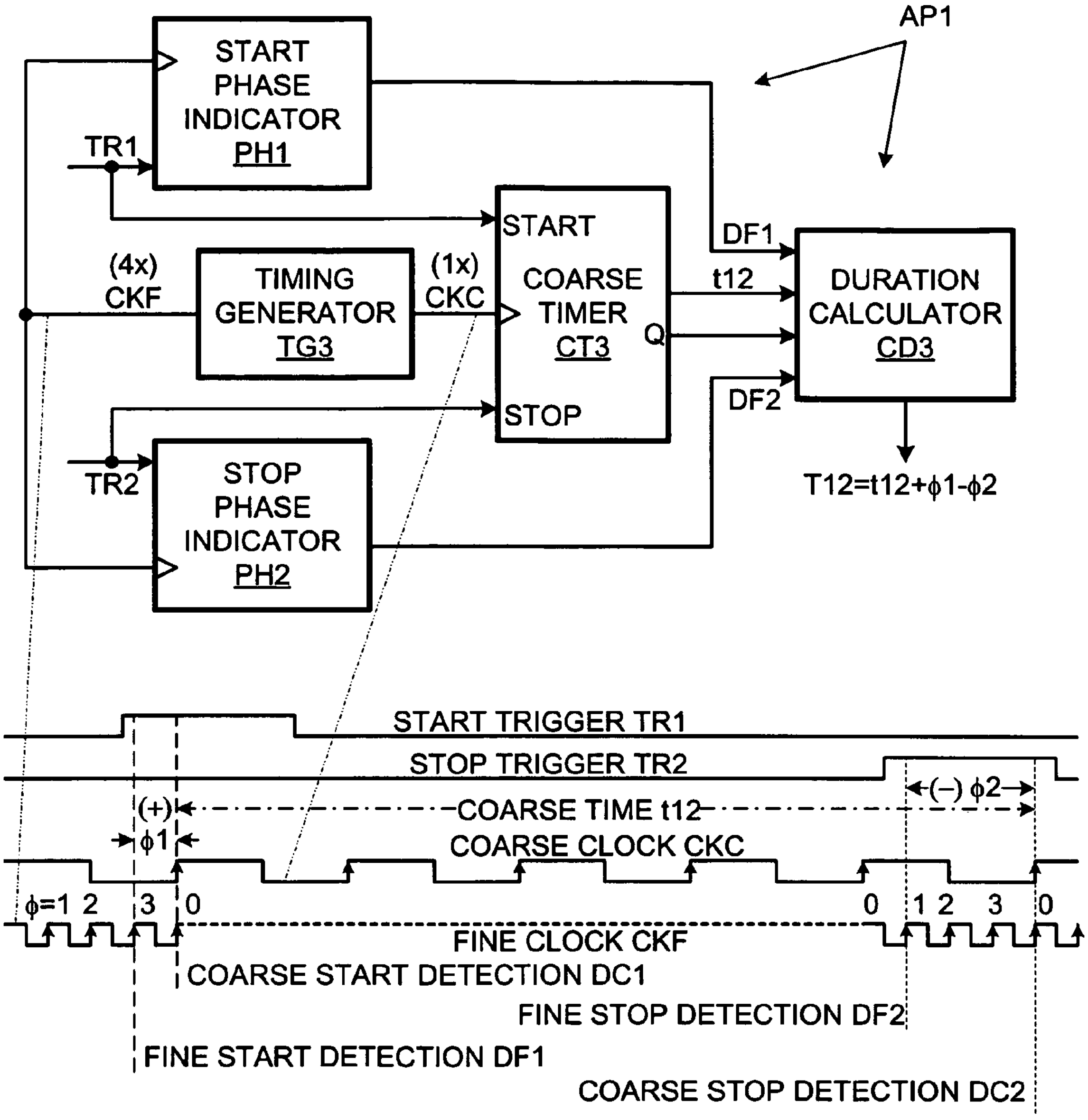
FIG. 1 is a block and timing diagram of first timing devices in accordance with the present invention.

A timing device AP1 in accordance with the present invention is shown in FIG. 1. Timing device AP1 is designed to provide a precise measurement of a duration T12 between a "start" trigger TR1 and a "stop" trigger TR2, both of which involve signal transitions. To this end, timing device AP1 includes a coarse timer CT3, which provides a coarse measure t12 of duration T12, and phase indicators PH1 and PH2 which provide corrections to the coarse measure to yield a precise measure of duration T12. These corrections are applied by duration calculator TC3.

Timing device AP1 has a timing generator TG3 that provides a coarse clock signal CKC and a fine clock signal CKF, the frequency of which is 400 MHz, four times the frequency 100 MHz frequency of the coarse clock CKC. The invention applies as well to other embodiments with different coarse and fine frequencies, as well as different multipliers between the coarse and fine clock frequencies. Also, the invention provides for embodiments in which the clock rates are adjustable and the multipliers are selectable.

Timing generator TG3 ensures that the clock signals CKC and CKF are in phase, as shown in the timing diagram near the bottom of FIG. 1. In this case, every fourth upward transition of fine clock signal CKF is synchronous with an upward transition of coarse clock signal CKC. In other embodiments, the clock signals are not in phase, but the phase relation is or can be determined.

Cycles of coarse clock CKC are counted by coarse timer CT3. Counting begins when an upwardly transitioning trigger waveform in start trigger signal TR1 is detected (at DF1 in the timing diagram at the bottom of FIG. 1) at the "start" input of timer CT3, and ends when subsequently an upwardly transitioning trigger waveform in stop trigger signal is detected (at DF2 in the timing diagram) at the "stop" input of timer CT3. Coarse timer includes a 20-bit counter, so durations up to over one second can be measured with a precision of a microsecond. Alternatively, counters with more or fewer bits can be used depending, for example, on the range of expected durations between start and stop triggers.

Upon the first upward clock transition of coarse clock signal CKC after the stop trigger is received, coarse timer CT3 asserts a "ready" signal at its output Q to duration calculator CD3. This read signal causes calculator CD3 to capture the stopped count t12 from coarse timer CT3. This count t12 is a coarse measure (in coarse clock cycles) of the duration between the triggers.

The start and stop triggers can arrive asynchronously relative to clock signals CKC and CKF. This means a start trigger can have arrived anytime during the coarse clock cycle preceding its detection by coarse timer CT3; likewise for the stop signal. Accordingly, the measured coarse duration t12 can be inaccurate by as much as one coarse clock cycle (e.g., if the start trigger is received at the beginning of its preceding clock signal and the stop trigger is received at the end of its preceding clock signal).

To improve the precision relative to the coarse duration measurement, phase indicators PH1 and PH2 provide relatively fine measures of the phase (and thus location of a trigger within the coarse clock cycle preceding detection) of the triggers. Start phase indicator PH1 includes a free-running two-bit down counter driven by fine clock signal CKF. Accordingly, indicator PH1 cycles through four states (3, 2, 1, 0), each corresponding to a quarter-phase of coarse clock signal CKC. When indicator PH1 detects a start trigger, the current state is latched at its output until timing device AP1 is reset. The latched value DF1 is provided to a corresponding input of calculator CD3. Stop phase indicator is similar, latching a current phase value DF2 when it detects a stop trigger and providing the latched value to a corresponding input of calculator CD3.

When coarse timer CT3 provides a ready signal to calculator CD3, the latter reads the coarse time value, the start phase value, and the stop phase value at its inputs. The start trigger typically arrives within the first, second, third or fourth fine clock signal before being detected by coarse timer CT3, and the indicated number of quarter cycles is added to the coarse time measurement. Thus, the start trigger arrives in the first preceding fine cycle (0), and then zero is added to the coarse time measurement. If the start trigger arrives during the second preceding fine cycle (1), one-quarter coarse cycle is added to the coarse duration. Likewise, 2 quarter coarse cycles are added if the trigger arrives during the third preceding fine cycle, and 3 quarter coarse cycles are added if the trigger arrives during the third preceding cycle, and 4 quarter coarse cycles are added if the trigger arrives in the fourth preceding cycle. In summary, the indicated number of fine cycles or coarse quarter cycles are added to the coarse duration measurement.

Similarly the stop trigger signal arrives in the coarse cycle preceding its detection by coarse timer CT3. Since the measured coarse duration extends beyond the time the stop trigger arrives, the stop phase value must be subtracted from the coarse time measurement. Thus, the precise measurement is the coarse duration plus the indicated number of quarter coarse cycles for the start trigger less the indicated number of quarter coarse cycles for the stop trigger. This is the value output by duration calculator CD3. Thus, precise timing of relatively long durations is achieved while distribution of a correspondingly high-frequency clock signal is limited.

The invention provides for many variations of the above-described embodiment. The clock frequencies and multipliers can be changed and be variable. There can be multiple levels, e.g., coarse, fine, and very-fine levels, or very coarse, coarse, fine, and fine levels, with only the first being counted for the full duration of the longest times that can be measured. In addition, the components can be varied, as can their arrangement, as the embodiment of FIG. 2 illustrates.

Figure 2:
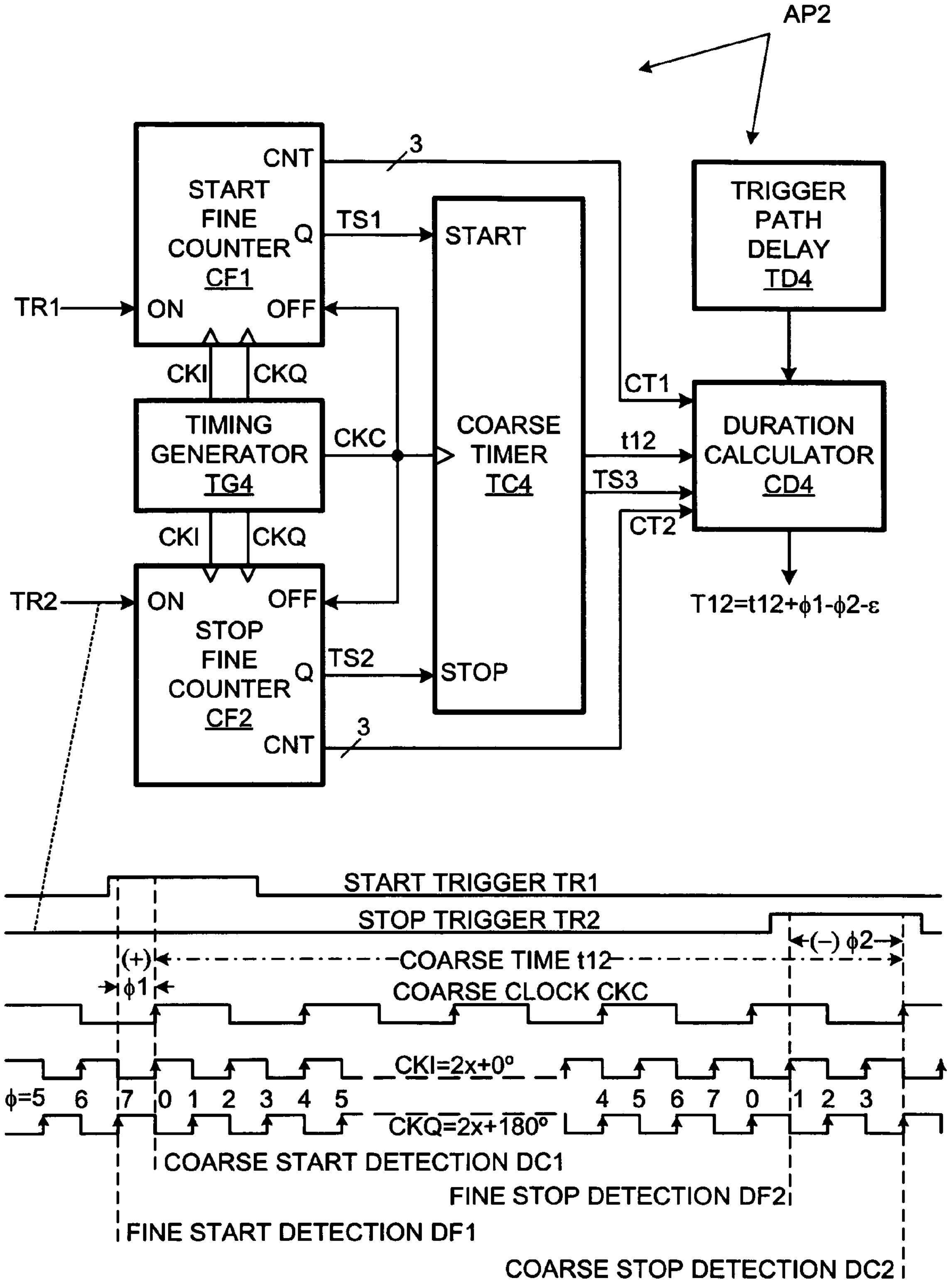
FIG. 2 is a block and timing diagram of a second timing device in accordance with the present invention.

A timing device AP2 is shown in FIG. 2 comprising a coarse timer TC4, start and stop fine counters CF1 and CF2, a timing generator TG4, a duration calculator CD4, and a trigger path delay module TD4. Timing generator TG4 generates a coarse clock signal CKC, and in-phase and quadrature fine clock signals CKI and CKQ. Coarse clock signal CKC is selectable, and fine clock signals CKI and CKQ have twice the frequency of coarse clock signal CKC. Both fine clock signals CKI and CKQ are synchronized to coarse clock signal CKC, and are 180° out-of-phase with respect to each other. The upward transitions of fine clocks CKI and CKQ are used to trigger both fine counters CF1 and CF2, so that the effective clock rate for these devices is four times the coarse-clock frequency that drives other devices of timing device AP2. Thus 4× clock rates are achieved for the fine counters using only 2× clock signals.

Start fine counter CF1 is a normally-off up counter that starts counting when a start trigger TR1 is detected, e.g., at the next up-transition of a fine clock signal CKI or CKQ at the counter's "ON" input. When a start trigger is detected begins counting up; also, start fine counter CF1 asserts, at its Q output, a synchronized trigger TS1 that is used to start coarse timer TC4 when the latter detects it at the next up transition of coarse clock CKC. Note that since the original trigger TR1 is only input to the 4× clocked fine counter CF1, it need only be one-quarter coarse dock period in duration to ensure detection, whereas derived trigger TS1 is asserted until the next coarse clock cycle begins to ensure detection by coarse timer TC4.

Counter CF1 is a 3-bit counter. It counts from 000=0 toward 111=7 until it is stopped by the next coarse-clock up transition at its OFF input. When the OFF transition is detected, the frozen count CT1 is transmitted from the CNT output of counter CF1 to a respective input of calculator CD4. Note that fine counter CF1 provides for eight different quarter-cycle counts for a total of two coarse clock cycles so that ambiguities between coarse cycle boundaries can be resolved as disclosed below in the discussion of calculator CD4.

Stop fine counter CF2 is the same as start fine counter CF1. However, it is arranged to receive stop trigger TR2, transmit a synchronous stop trigger TS2 to a STOP input of coarse timer TC4, and a 3-bit stop phase count CT2 to a corresponding input of calculator CD4.

Coarse timer TC4 is a 16-bit up counter. It starts counting coarse clock up transitions when synchronous start trigger TS1 is detected, and stops counting when synchronous stop trigger TS2 is detected. When the stop trigger is detected, coarse timer TC4 transmits the frozen count t12 to calculator CD4. In addition, timer TC4 asserts a synchronous trigger signal TS3 to calculator CD4 to indicate the values required to calculate the duration being measured are available.

When calculator CD4 detects synchronous trigger TS4, it calculates the duration T12 to be measured as a function of coarse duration t12, start phase count CT1, and stop phase count CT2 according to the formula $t12+\phi1-\phi2+\epsilon$, where $\epsilon$ is an error term as discussed below. In addition, any errors due to path differences (supplied by trigger path delay store TD4) can be compensated for, as represented by the error term $\epsilon$ in the formula below calculator TC4. However, error term $\epsilon$ also represents a measurement error that can be detected and compensated for, as described below.

The coarse duration count t12 is a whole number that can be even or odd. If it is even, the phase counts CT1 and CT2 should be in the same half modulo-8 cycle, either both are 0-3 or both are 4-7. If they are in different half modulo-8 cycles, then the phase data is inconsistent with the coarse count. Likewise, if the coarse count is odd, the phase counts should be in different halves of modulo-8 cycles; if they are not different, the coarse count is inconsistent with the phase data. In either case, if the inconsistency can be corrected by changing phase value of 7 to 0 or vice-versa, this adjustment is made. Then the phase values are converted to modulo-4 values.

Then the formula of FIG. 2 is applied. Note that timing device AP1 of FIG. 1 can be modified so that the phase indicators PH1 and PH2 distinguish between even and odd coarse cycles and make use of this "inconsistency" method of resolving cycle boundary ambiguities.

The present invention also provides for many variations of timing device AP2. The clock rates can be fixed or selectable, as can the multiplier between the coarse and fine frequencies. A single fine clock signal can be generated, or two or more can be generated with staggered phases. Also, devices can trigger on up transitions, down transitions or both. Different approaches to detecting asynchronous triggers and generated synchronous triggers can be employed.

Figure 3:
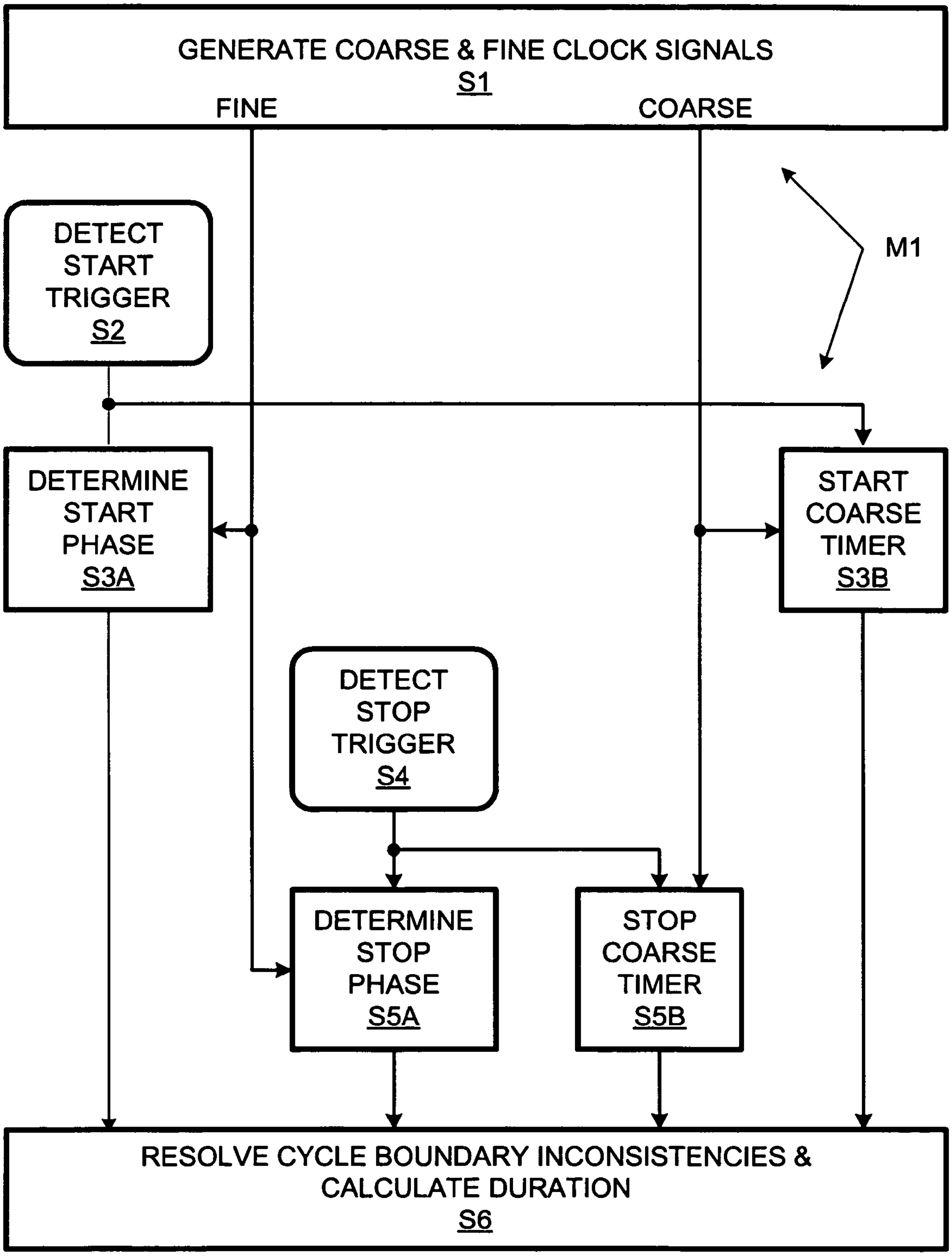
FIG. 3 is a flow chart of a method of the invention, which method can be practiced in the context of the timing devices of FIGS. 1 and 2.

A method of the invention M1, flow charted in FIG. 3, can be implemented with suitable variation in the context of many devices in accordance with the invention. At method segment S1, coarse and fine clocks are generated. Typically, there will be a single coarse clock, but single, quadrature or other staggered fine clocks may be generated. Also, the number of levels of coarseness can be two or more.

At method segment S2, a start trigger TR1 is detected. Typically, start trigger TR1 is detected by a start phase device such as indicator PH1 of FIG. 1 or counter CF1 of FIG. 2. Start trigger TR1 can also be detected by a coarse timer, directly as in device AP1 or indirectly, as in device AP2.

Next, a start phase is determined at method segment S3A and the coarse timer is started at method segment S3B. While the order of method segments S3A and S3B is not critical, they are essential simultaneous in timing devices AP1 and AP2. The start phase is typically determined using a counter, which, depending on the embodiment, can be an up counter or a down counter, and can be a free-running counter, or one that starts when triggered. The count can be frozen, e.g., stopped or latched, for use in calculating the duration to be measured. The coarse timer can be an up counter that starts counting upon detection of an asynchronous trigger signal or a synchronous trigger signal derived therefrom. The latter case can be adapted to ensure detection of short trigger pulses, as described above with respect to timing device AP2.

A stop trigger signal can be detected at method segment S4. Depending on the embodiment, it can be detected directly by both a fine timer and a coarse timer, or directly by the fine timer and indirectly by the coarse timer. The fine timer can be the same device used to detect the start trigger or a separate (in some cases, identical) device. Next, a stop phase is determined at method segment S5A and the coarse timer is stopped at method segment S5B (thereby determining coarse duration t12). Method segments S5A and S5B can be simultaneous but need not be.

Method segment S6 provides a calculation of the duration to be measured using the coarse duration corrected by the start phase determined in method segment S3A and by the stop phase determined in method segment S5A. In addition, correction can be made for systematic error, such as pre-characterized differential path lengths for the start and stop triggers.

Method segment S6 can further provide for corrections of inconsistencies between the coarse duration and the phase data. As discussed in connection with timing device AP2, when fine counters can count up to two coarse clock cycles, the evenness or oddness of the coarse duration can conflict with the relations between the start and stop phases. In some cases, this inconsistency can be resolved by changing one of the phase values to avoid errors on the order of a coarse clock cycle. Of course, the fine counters can also have cycles greater than two coarse clock cycles and provide for such corrections.

On the other hand, if such boundary errors are non-existent or acceptably rare, the fine counters can cycle at the coarse clock rate. For example, multiple measurements can be used to statistically remove rare errors.

One additional feature is to disable the start trigger inputs while the coarse timer is active so that a second start trigger signal does not interfere with the current measurement. This can be important when trying to determine durations between two sets of repeating pulses, where the start pulse rate is greater than the stop pulse rate.

Alternative embodiments use different approaches to achieving phase measurements that are more precise than the coarse duration measurements. Firstly, some embodiments increment more than once per received clock cycle. For example, a fine timer can count (increment or decrement) on both up and down transitions of a coarse clock, while the coarse time only increments on up transitions. Secondly, some embodiments trigger on multiple phases of staggered replicas of a clock signal. For example, a fine timer can count in response to up transitions from both in-phase and quadrature replicas of a coarse clock; alternatively, more than two phases can be used to achieve even finer phase timing. Thirdly, a fine timer can count in response to a multiple of the coarse clock (as in devices AP1 and AP2). Clearly these approaches can be used individually (as in device AP1) or in pairs (as in device AP2) or all three can be used together. Note that when the first and/or second approach is used without the third, it is not necessary to derive a clock signal of frequency higher than that of the coarse clock.

The invention also provides for driving fine timers using independently generated clock signals that have higher clock rates or at least take advantage of the three techniques mentioned above to achieve higher counting rates. One or both of the start fine timer or the stop fine timer can use an independent clock and the two fine timers can be driven by clocks that are independent from each other. Such embodiments can employ phase extractors to determine post hoc the phase relationships between the fine and coarse timers.

While most embodiments provide for both start and stop phase measurements, the precision of a coarse duration measurement can be enhanced in embodiments, which provide only a start phase measurement or only a stop phase measurement.

The present invention has industrial applicability in several areas, including device testing where timing data is critical. An example would be in testing transceiver stations for cellular phone networks. It can be costly to build devices that can generate and distribute clock signals of sufficiently high frequency to determine whether such transceivers are within specifications. Certain embodiments of the invention allow high precision duration measurements to be achieved with limited distribution of high-frequency clock signals derived from more widely distributed relatively low-frequency clock signals. These and other industrial applications are provided for by the present invention as defined in the claims.

What is claimed is:

1. A digital timing device for measuring a duration between a start trigger and a stop trigger, said device comprising:

a timing generator for providing a coarse clock signal;

a coarse timer for providing a relatively coarse measurement of the duration between said start trigger and said stop trigger, said coarse timer being driven by said coarse clock signal;

a first fine timer for providing a first phase measurement between said coarse clock signal and at least one of said start trigger and said stop trigger said first phase measurement being between said start trigger and said coarse clock signal;

a second fine timer for providing a second phase measurement, said second phase measurement being between said stop trigger and said coarse clock signal; and a calculator for calculating a relatively precise measure of said duration at least partially from said coarse measurement and said first phase measurement.

2. A device as recited in claim 1: wherein said start trigger is input directly to said first fine timer for detection thereby, said first fine timer generating a start synchronous trigger in response to detecting said start trigger; and wherein said stop trigger is input directly to said second fine timer for detection thereby, said second fine timer generating a stop synchronous trigger in response to detecting said stop trigger; said coarse timer providing said coarse measurement by providing a duration count of cycles of said coarse clock signal occurring between detection of said start synchronous trigger and detection of said stop synchronous trigger.

3. A device as recited in claim 1 wherein said coarse timer has a coarse counter with a coarse-count duration and a coarse cycle duration, said first and second fine timers having fine count durations shorter than said coarse count duration and fine cycle durations exactly twice said coarse-count duration, said coarse timer providing a coarse count of the number of coarse count durations between said start and stop triggers.

4. A device as recited in claim 3 wherein said calculator includes: means for detecting an inconsistency between an evenness or oddness of said coarse count and a relationship between said first and second phase measurements, and means for taking said inconsistency into account in calculating said duration.

5. A device as recited in claim 1 wherein said first fine timer is coupled to said timing generator for receiving plural phase-staggered clocks therefrom.

6. A device as recited in claim 1 wherein said first fine timer is coupled to said timing generator for receiving a fine clock signal therefrom, said fine clock signal having a fine-count duration shorter clock than said coarse-count duration.

7. A device as recited in claim 1 wherein said first fine timer is coupled to said timing generator for receiving said coarse clock signal therefrom, said first fine timer counting up and down transitions of said coarse clock signal.

8. A device as recited in claim 1 wherein said coarse timer has an input for receiving said start trigger.

9. A device as recited in claim 1 wherein said calculator calculates said high-precision measurement in part as a function of a predetermined path differential path delay associated with said start and stop triggers.

10. A method for providing a high-precision measurement of a duration between start and stop triggers, said method comprising:

detecting said start trigger;

determining a start phase of said start trigger relative to a coarse clock that defines a coarse clock cycle; detecting said stop trigger;

determining a stop phase of said stop trigger relative to said coarse clock;

determining a coarse duration measurement between said start and stop triggers by counting a number of coarse clock cycles occurring therebetween; and calculating said high-precision measurement at least in part as a function of said coarse duration measurement and said start and stop phases, wherein said determining said start phase involve counting cycles in a fine clock that is faster than said coarse clock.

11. A method as recited in claim 10 further comprising: upon detection of said start trigger, generating a start synchronous trigger; detecting said start synchronous trigger; upon detection of said start synchronous trigger, begin counting said coarse clock cycles; upon detection of said stop trigger, generating a stop synchronous trigger; detecting said stop synchronous trigger; and upon detection of said stop synchronous trigger, freezing said counting of said coarse clock signals to determine said coarse duration measurement.

12. A method as recited at claim 10 wherein: said determining a start phase involves fine counting at a rate greater than said coarse clock, wherein said fine counting cycles exactly every two coarse clock cycles.

13. A method as recited in claim 12 further comprising detecting an inconsistency between an even or an oddness of said coarse measurement and a relationship between said start phase and said stop phase.

14. A method as recited in claim 13 further comprising taking said inconsistency into account in calculating said duration measure.

15. A method as recited in claim 10 wherein said determining said start phase involves counting transitions in multiple phase-staggered clock signals.

16. A method as recited in claim 15 wherein said phase-staggered clock signals have frequency greater than that of said coarse clock signal.

17. A method as recited in claim 10 wherein said determining said start phase involves counting up and down transitions of a clock.

18. A method as recited in claim 10 wherein said calculating calculates said high-precision measurement in part as a function of a predetermined path differential path delay associated with said start and stop triggers.

* * * * *

UNITED STATES PATENT AND TRADEMARK OFFICE

CERTIFICATE OF CORRECTION

PATENT NO. : 7,649,969 B2
APPLICATION NO. : 11/339007
DATED : January 19, 2010
INVENTOR(S) : Larry Alan Parker It is certified that error appears in the above-identified patent and that said Letters Patent is hereby corrected as shown below:

In column 6, line 66, in Claim 10, delete "involve" and insert -- involves --, therefor.

Signed and Sealed this

Thirtieth Day of March, 2010

David J. Kappos

David J. Kappos
*Director of the United States Patent and Trademark Office*